United States Patent [19]

Long, Jr.

[11] Patent Number: 5,062,201

[45] Date of Patent: Nov. 5, 1991

[54] INSERTION/EXTRACTION TOOL FOR SUBSTRATE PACKAGE

[75] Inventor: Alden O. Long, Jr., Carlisle, Pa.

[73] Assignee: AMP Incorporated, Harrisburg, Pa.

[21] Appl. No.: 623,468

[22] Filed: Dec. 7, 1990

[51] Int. Cl.$^5$ .................... H05K 13/04; H05K 3/30
[52] U.S. Cl. .................................. 29/741; 21/764
[58] Field of Search .............. 29/741, 739, 764, 758, 29/747, 268, 837–839

[56] References Cited

U.S. PATENT DOCUMENTS

| | | | |
|---|---|---|---|
| 4,392,301 | 7/1983 | Hannes et al. | 29/741 |
| 4,615,110 | 10/1986 | Crone | 29/741 |
| 4,679,319 | 7/1987 | Grabbe et al. | 29/843 |
| 4,827,607 | 5/1989 | Korsunsky et al. | 29/741 |
| 4,873,761 | 10/1989 | Korsunsky et al. | 29/741 |

*Primary Examiner*—Carl E. Hall

[57] ABSTRACT

Insertion/extraction tool for inserting a substrate into, and extracting a substrate from, a socket assembly has a frame assembly containing force multiplying means and a yoke. Spaced-apart yoke arms extend from the yoke and have ends which will engage either the socket assembly or the underside of the substrate. First frame arms are fixed to the frame and have ends which are spaced from the ends of the yoke arms. Second frame arms are slidably mounted on the frame assembly for movement between extended positions and retracted positions. When inserting the substrate, the yoke arms are located between the underside of the socket and the surface of the circuit board on which the socket is mounted. The frame is moved towards the end of the yoke arms so that the first frame arms push the substrate into assembled relationship with the socket. When the tool is used for extraction, the second frame arms are moved to their extended positions and are located on the surface of the circuit board. The end of the yoke arms are positioned between the underside of the substrate and the upper surface of the socket assembly, The yoke is then moved upwardly by the force applying means and away from the circuit board so that the yoke arms pull the substrate upwardly and from the socket assembly.

19 Claims, 7 Drawing Sheets

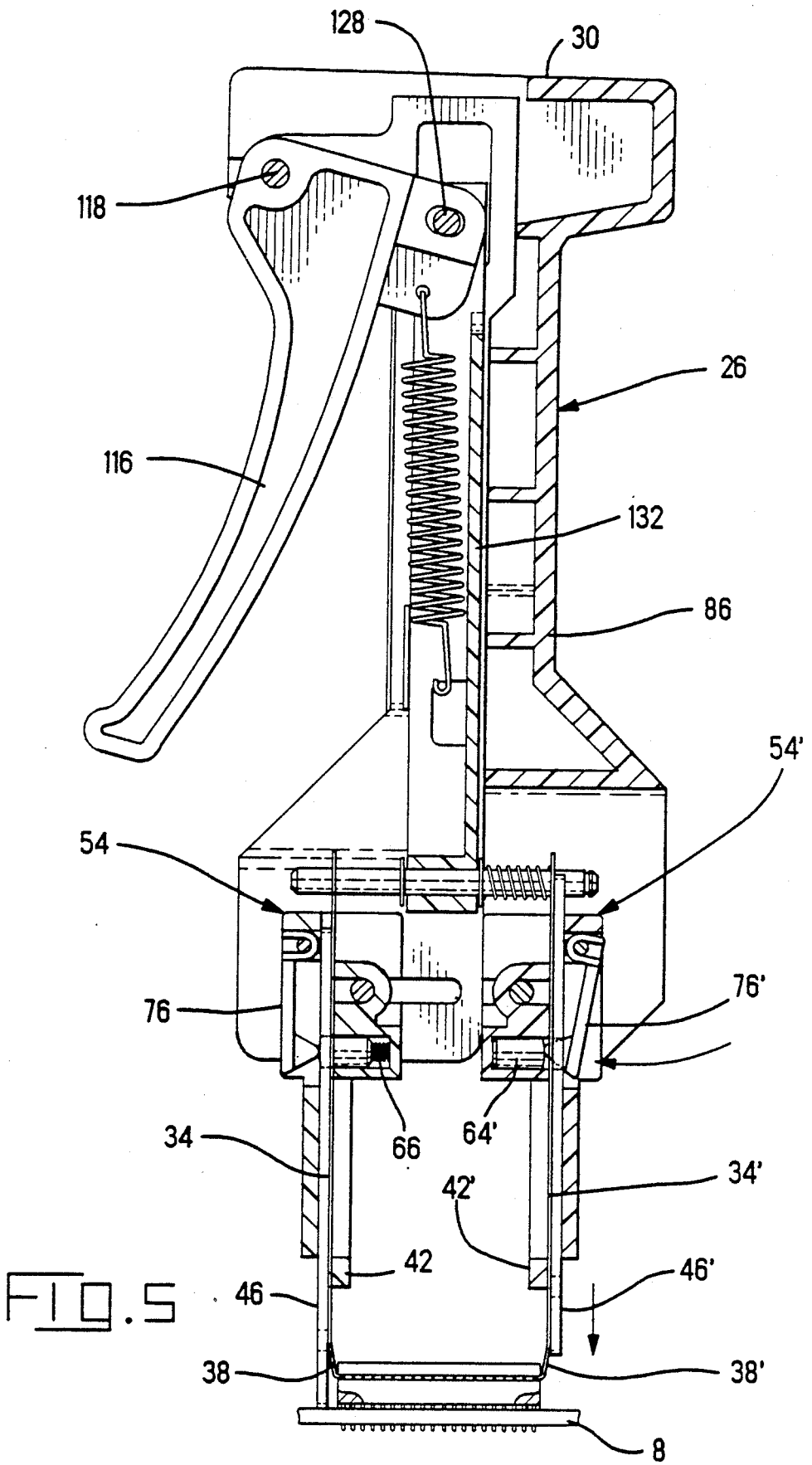

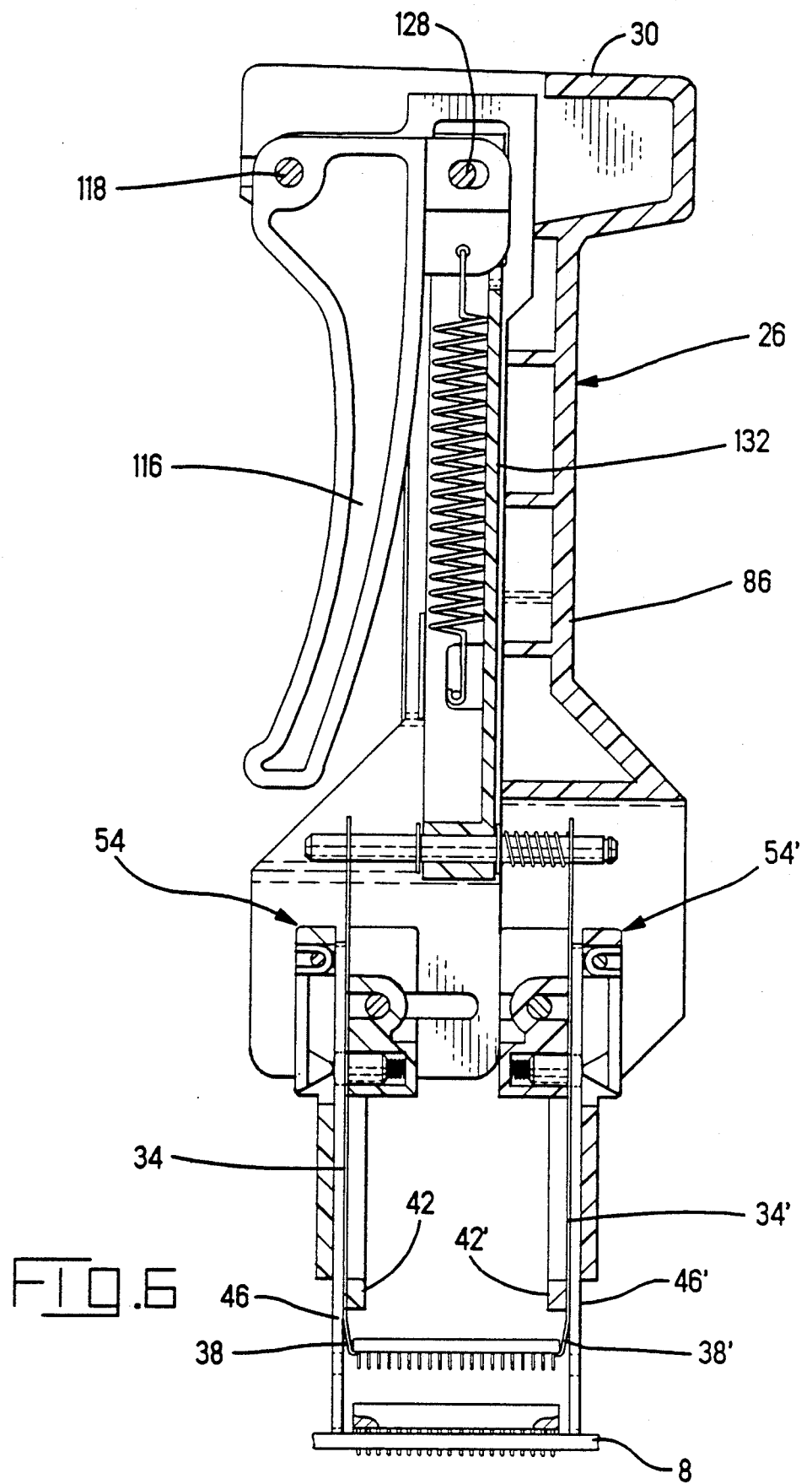

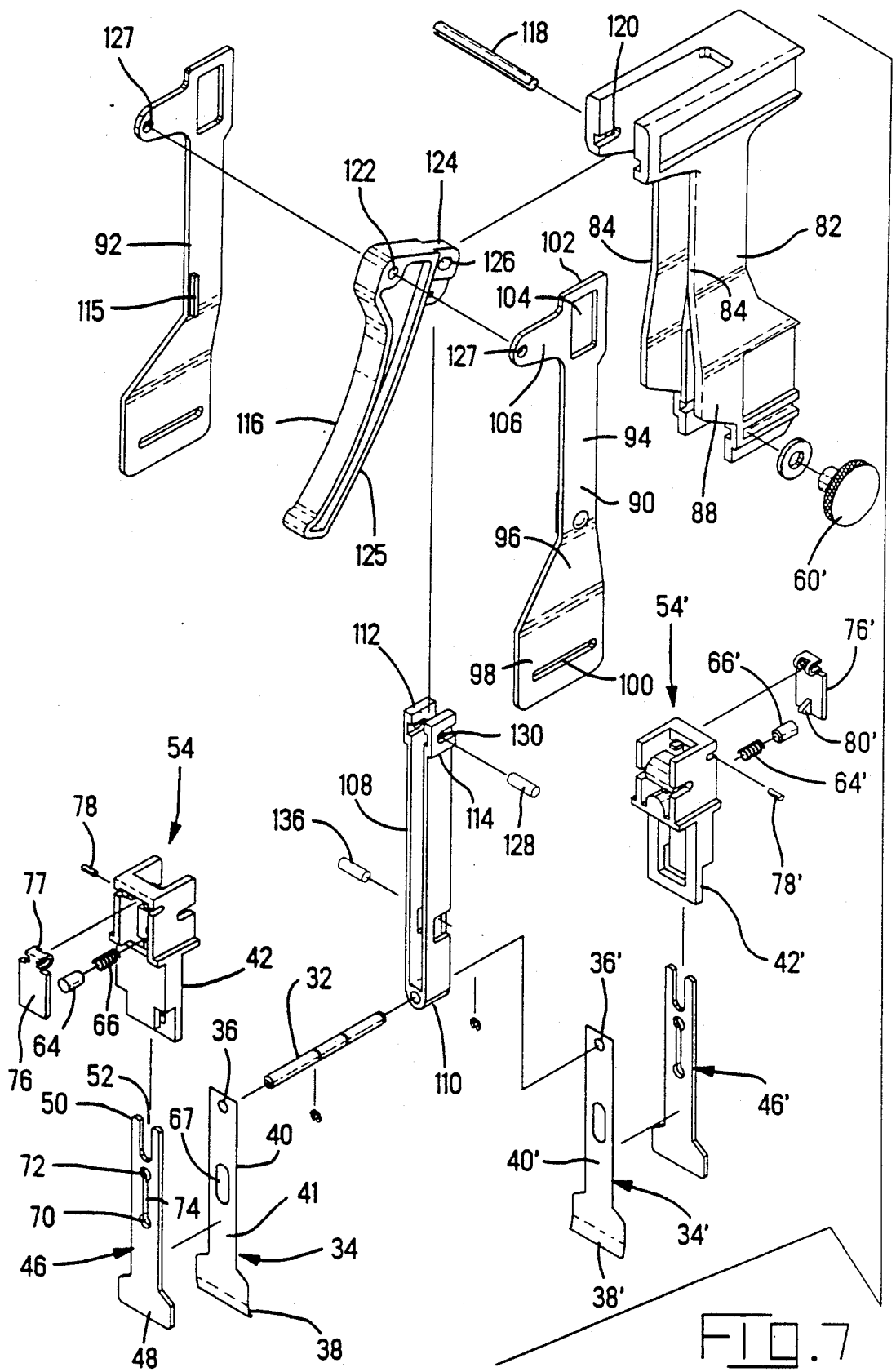

INSERTION/EXTRACTION TOOL FOR SUBSTRATE PACKAGE

FIELD OF THE INVENTION

This invention relates to tools for inserting the contact pins extending from a substrate package into the sockets of a socket assembly and for removing the substrate package from the socket assembly.

BACKGROUND

A widely used type of electronic package comprises a housing which is generally rectangular or square having a plurality of pins extending from one of its surfaces. Quite often, as many as several hundred pins arranged on a grid pattern will extend from the surface of a package. The substrate package is connected to further circuitry by means of a socket which is mounted on a circuit board. The socket has a socket contact for each of the pins extending from the pin grid array (PGA) substrate. While the force required to insert an individual pin into an individual socket is relatively small, the force required to assemble a PGA substrate to a socket can be quite high when the substrate has several hundred pins. Also, it is essential when inserting the pins of the substrate into the socket contacts of the socket assembly to move the substrate in a direction which extends normally of its plane and to extract the substrate or remove the substrate from the socket assembly in the same manner. The pins are quite delicate, and if there is any cocking or lateral movement of the substrate during insertion or extraction, some of the pins may be damaged.

A variety of single purpose tools are available for either extracting or inserting substrates into a socket assembly, that is, tools which are capable of only one of the two operations. A lesser number of tools are known which are capable of both inserting and extracting substrates from sockets. U.S. Pat. No. 4,615,110 describes an insertion/extraction tool which is capable of use under circumstances where the sockets are very close together on the circuit board. This tool is relatively complex and has many moving parts so that it would be relatively expensive to produce.

U.S. Pat. No. 4,873,761 discloses an insertion/extraction tool for chip carriers and chip carrier sockets. This tool has a force multiplication system for the insertion operation; however, when the chip carrier is extracted from the chip carrier socket, the tool merely functions as a gripping tool and does not have any system for applying leveraged force to the extraction operation.

The present invention is directed to the achievement of a relatively simple and inexpensive tool for assembling substrates to, and disassembling substrates from, a socket which is mounted on a circuit board or the like.

THE INVENTION

A preferred embodiment of the invention comprises an insertion/extraction tool for assembling a substrate package to and disassembling the substrate package from, a socket which is mounted on a circuit board. The tool comprises a frame assembly, a yoke, spaced-apart yoke arms which extend from the yoke, first and second pairs of frame arms, and actuating means. The frame assembly has a first end and the yoke is in the frame assembly proximate to the first end. The yoke arms are spaced apart and extend from the yoke towards, and past or beyond, the first end. The yoke arms have free ends which are inwardly turned and have opposed first side surfaces and oppositely facing second side surfaces. The first pair of frame arms are substantially against the first side surfaces of the yoke arms. The second pair of frame arms are substantially against the second side surfaces of the yoke arms so that each yoke arm is between one first frame arm and one second frame arm. The first frame arms have free ends which are between the first end of the frame assembly and the free ends of the yoke arms. The second frame arms are slidably mounted on the frame assembly for movement between extended positions and retracted positions. The second frame arms have free ends which are remote from the first end of the frame assembly and located beyond the free ends of the yoke arms when the second frame arms are in their extended positions. The free ends of the second frame arms are proximate to the first end of the frame assembly when the first frame arms are in their retracted positions. The actuating means is effective to move the yoke and the first end of the frame assembly relatively towards and away from each other. In use, the substrate package can be assembled to the socket by moving the second frame arms to their retracted positions, locating the substrate package on the socket with the substrate pins in alignment with the socket receptacles, locating the tool above the substrate with the free ends of the yoke arms between the surface of the circuit board and the underside of the socket. The frame assembly is moved towards the free ends of the yoke arms by the actuating means so that the free ends of the frame arms will move against the substrate and push the substrate into assembled relationship with the socket. The substrate can be disassembled from the socket by moving the second frame arms to their extended positions, locating the tool above the substrate with the free ends of the second frame arms on the surface of the circuit board, and with the free ends of the yoke arms between the opposed surfaces of the substrate and the socket. The yoke is thereafter moved away from the first end of the frame assembly by the actuating means whereby the yoke arms will pull the substrate from the socket.

THE DRAWING FIGURES

FIG. 5 is a view showing the positions of the parts when preparing to extract or disassemble a substrate from a socket.

FIG. 6 is a view showing the positions of the parts at the completion of the extraction operation.

FIG. 7 is a perspective view showing all of the parts of the tool exploded from each other.

THE DISCLOSED EMBODIMENT

Figure 3:
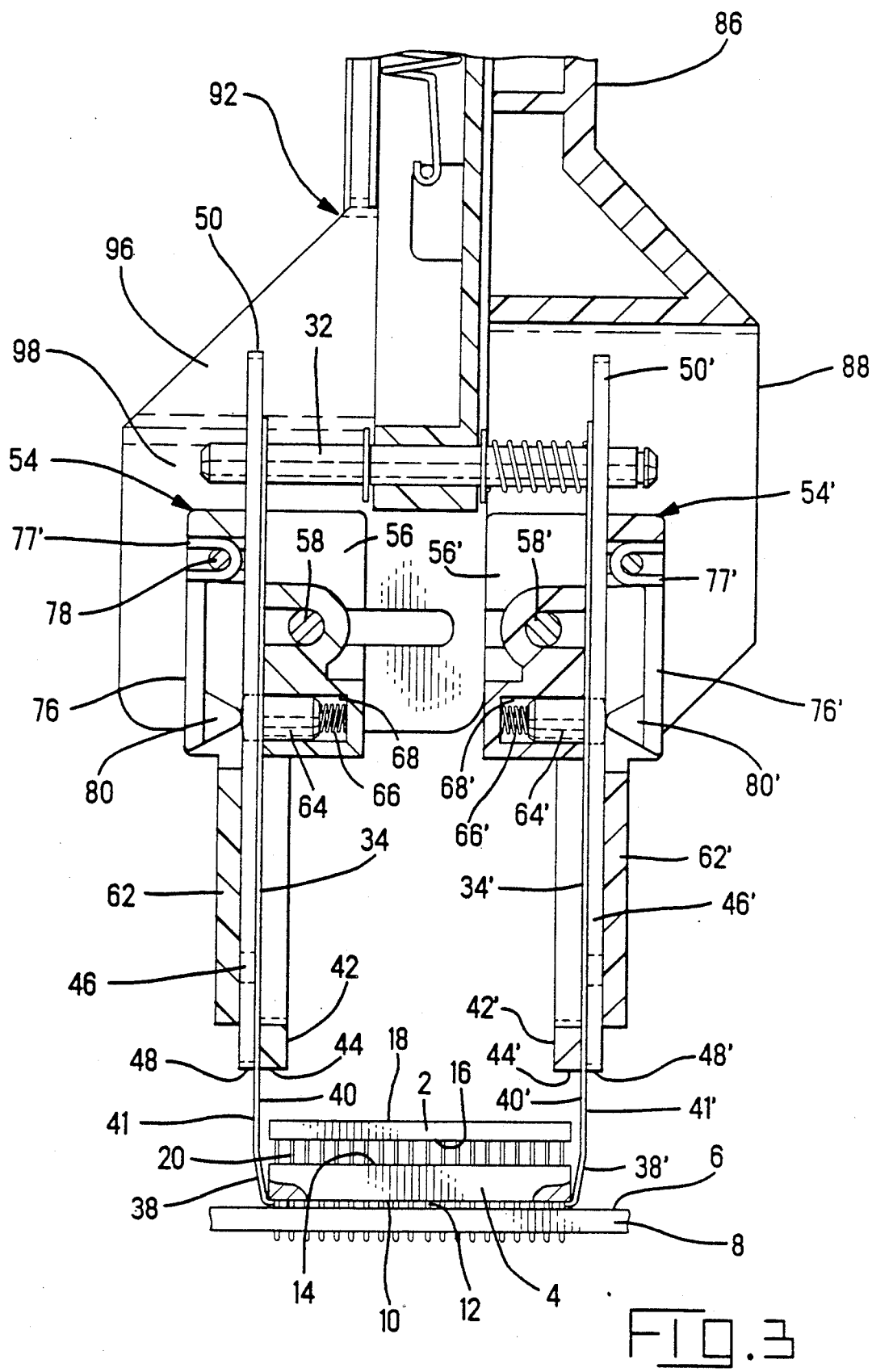
FIG. 3 is a view on an enlarged scale of the tool as shown in FIG. 2.
Figure 4:
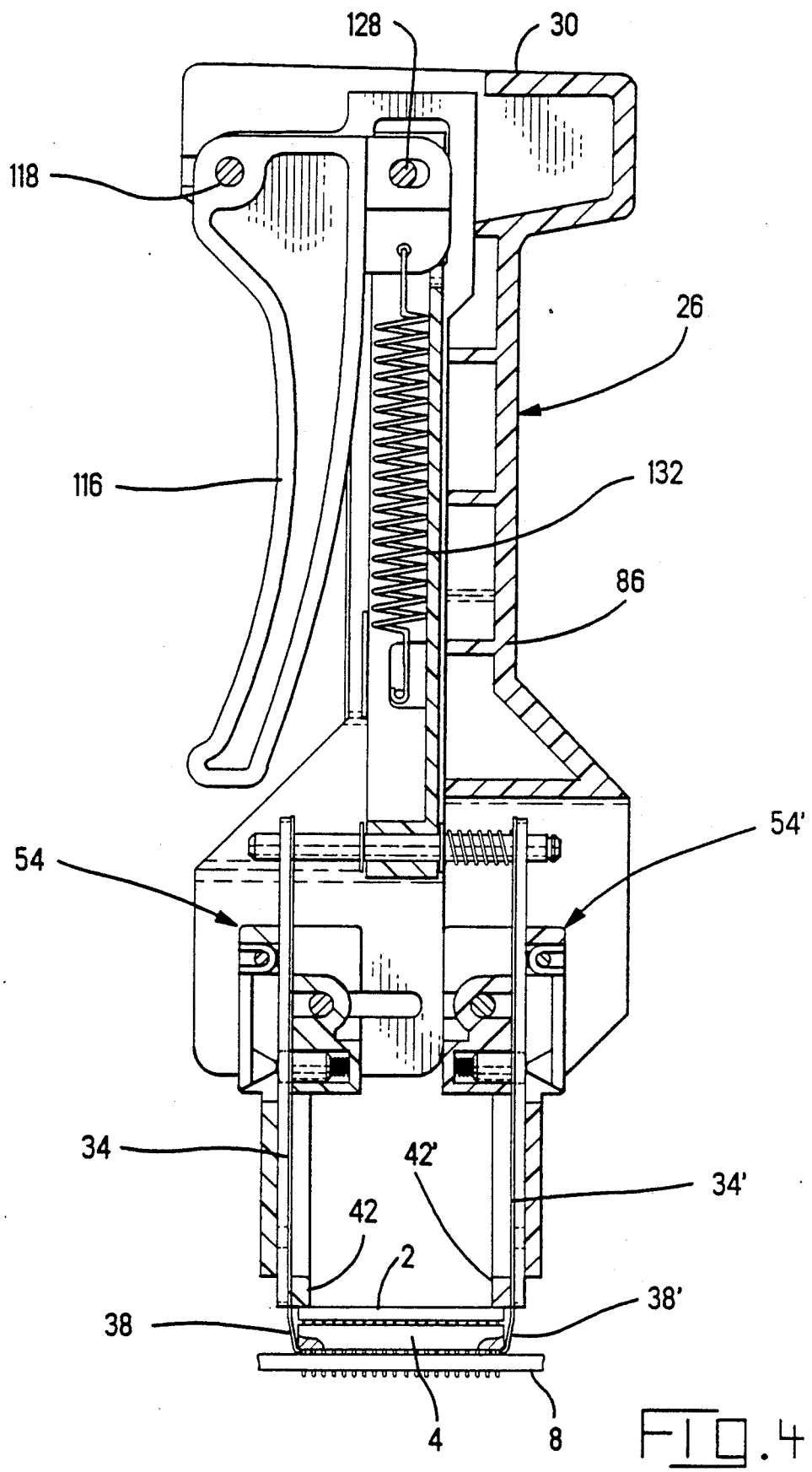
FIG. 4 is a frontal view showing the positions of the parts at the completion of the insertion operation.

FIG. 3 shows a typical substrate 2 and a socket 4 which is mounted on the upper surface 6 of a circuit board 8. The socket has a lower, or downwardly facing, surface 10 from which socket pins 12 extend. The socket has an upwardly facing surface 14 which is opposed to the lower or downwardly facing surface 16 of the substrate 2. The substrate has an upwardly facing surface 18 which is engaged by the insertion tool in a manner described below. Substrate pins 20 extend from the lower surface 16 of the substrate 2 and are received in openings in the socket assembly. Contact sockets are contained in these openings and the socket pins 12 are integral with these socket contacts and are soldered or otherwise connected to conductors on the circuit board 8.

When the substrate 2 is assembled to, or disassembled from, the socket assembly 4, it is essential that the substrate be moved in a direction perpendicular to its plane in order to avoid damage to the substrate pins 20. Also, it is desirable to have a force multiplication system in the extraction tool for the reason that the substrate may contain several hundred pins and the force required for an extraction or assembly operation will be substantial.

Referring now to FIGS. 1–3 and 7, a tool 24, in accordance with the invention, comprises a frame assembly 26 having a lower or first end 28 and an upper second end 30. Ordinarily, the tool will be used in a vertical orientation as shown and the terms lower, and upper are therefore used throughout this description. It will be understood that the tool can be used in a different orientation than that shown.

A yoke 32 in the form of a cylindrical rod extends horizontally within the frame assembly adjacent to, but spaced from, the lower end 28. Two spaced-apart blade-like yoke arms 34, 34' are secured to the yoke and extend downwardly beyond the first end of the frame assembly. As shown in FIG. 7, the yoke arms have circular holes 36, 36' through which the yoke extends and the yoke arms are retained in their positions by suitable retaining rings as shown. The free ends 38, 38' of the yoke arms are located beyond the first end 28 of the frame assembly and are inwardly turned as shown so that they can be positioned between the substrate and the socket or between the socket and the surface of the circuit board. The yoke arms have first side surfaces 40, 40' which are opposed to each other and second side surfaces 41, 41' which face outwardly in opposite directions.

Figure 1:
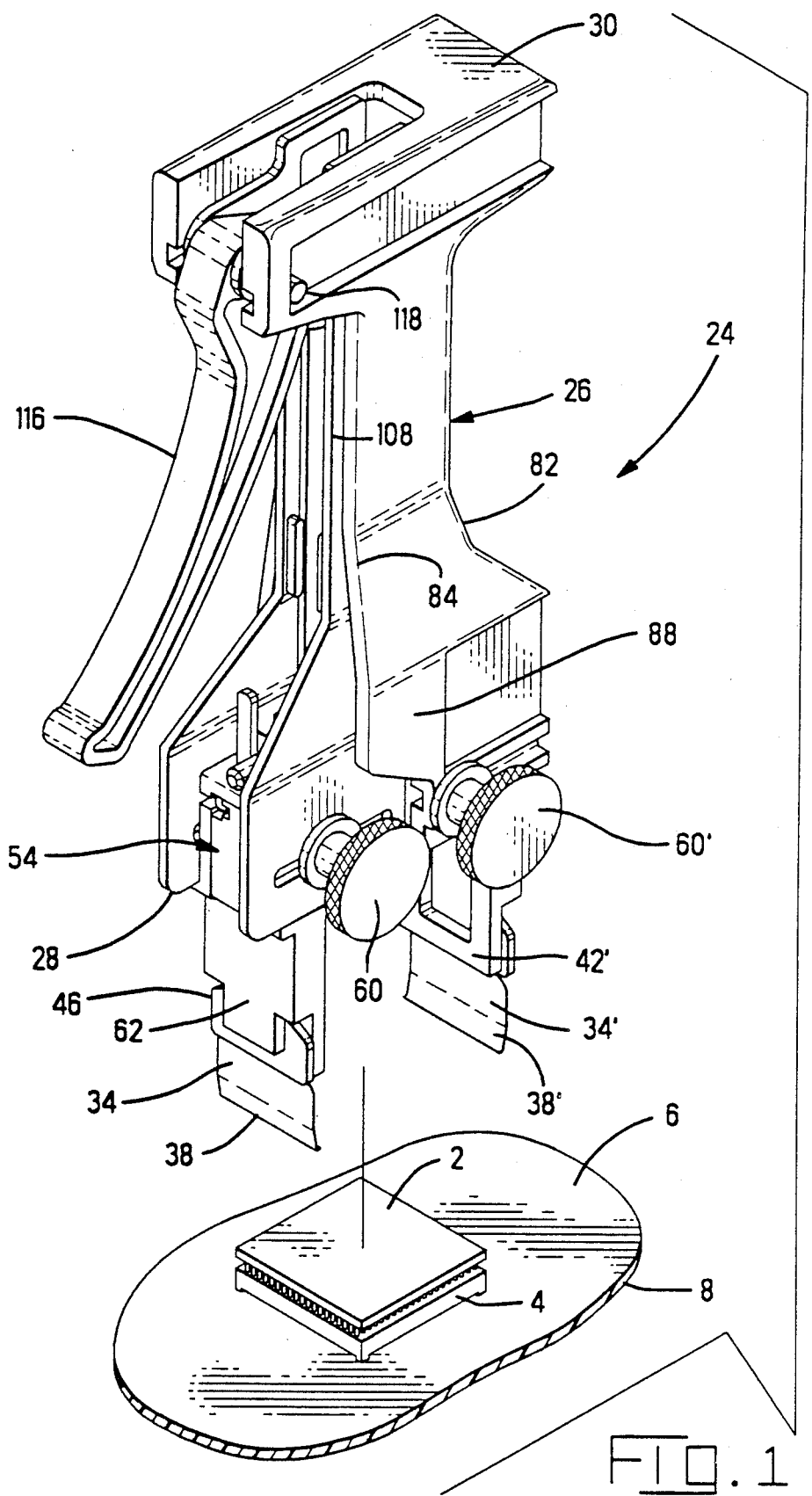
FIG. 1 is a view showing a tool in accordance with the invention.
Figure 2:
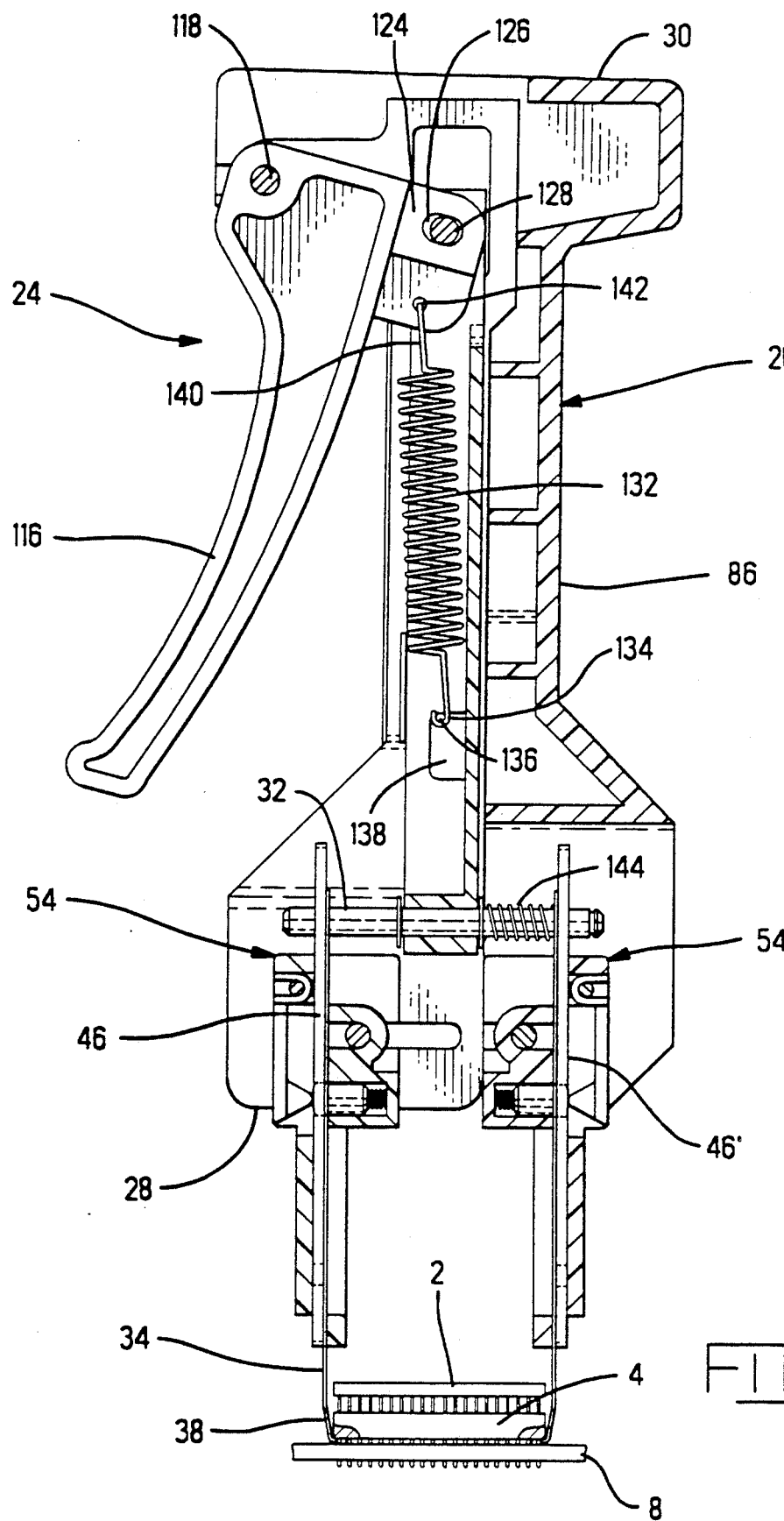
FIG. 2 is a sectional frontal view of the tool, this view showing the positions of the parts and the location of the tool when preparing to insert a substrate into a socket assembly.

The portions of the tool described immediately below, that is, the yoke arms and the two pairs of frame arms, are on opposite sides of the vertical center line of the tool as viewed in FIG. 2 and are mirror images of each other. Accordingly, the same reference numerals, differentiated by prime marks, will be used to identify corresponding parts on each side of the center line. In the description which follows, only the frame arms and associated structural members on the left-hand side of the center line as viewed in FIG. 2 will be specifically described and reference will be made to corresponding structural parts on the right-hand side where necessary.

A first frame arm 42 extends downwardly from the frame assembly and is fixed thereto. This first frame arm has a flat lower end 44 which engages the upper surface 18 of the substrate during an insertion operation. A second frame arm 46 is slidably contained against the second side surface 41 of the yoke arm 32 and is relatively thin. This second frame arm has an enlarged lower portion 48 which has a flat surface which bears against the surface 6 of the circuit board 8 during an extraction operation. The second frame arm 46 has a slot 52 extending downwardly from its upper end 50 so that it can be moved between the positions shown in the drawing past the yoke 32.

The yoke arm 34 and the frame arms 42, 46 are carried by, or integral with, a subassembly 54 comprising a molded housing or body portion 56 which is contained in, and secured to, the lower portion of the frame assembly 26 by a carriage bolt 58 which extends laterally through an opening in the body portion 56 and which has a thumb nut 60 threaded onto its end. The body portion 56 has a depending support member 62 which extends beside the second frame arm 46 and confines it for movement between its extended and retracted position.

The second frame arm 46 is retained in either its extended or retracted position by means of a plunger 64 which is contained in a cavity 68 in the body portion 56 and is resiliently biased by a spring 66 through an opening 67 in the yoke arm and against the second movable frame arm. As shown in FIG. 7, the second frame arm has spaced-apart holes 70, 72 which are connected by a narrow slot 74. Plunger 64 has a conical end which is dimensioned to enter either of the holes 70, 72 thereby to retain this frame arm in its position. In order to permit movement of the frame arm 46 from one position to the other, a depressor 76 is provided which is hinged to the body portion 56 by means of a hinge 77 and hinge pin 78. This depressor can be moved inwardly from its position shown in FIG. 3 and has a narrow tooth 80 on its rightwardly facing surface so that the plunger will be pushed rightwardly when the depressor is swung through a slight counter-clockwise arc. The frame arm 46 can then be slid from either position to the other, the thickness of the tooth 80 being less than the width of the slot 74.

The frame assembly comprises a fixed frame section 82 and a movable frame section described below. The fixed frame section has an intermediate portion which is channel-shaped in cross-section having parallel sides 84 which are connected by a web 86. The lower end portion of the frame section 82 is enlarged so that the side walls diverge thereby to permit reception of the subassembly 54' between their opposed surfaces. The carriage bolt 58' extends through aligned openings in the sides 84 and the thumb nut bears against the external surfaces of one of these sides while the head of the carriage bolt is against the other external surface.

The movable frame section comprises a pair of side plates 90, 92 which are mirror images of each other. Each side plate has an intermediate shank portion 94, a transition section 96, and a lower end section 98 which is enlarged. A slot 100 is provided in each of the lower end sections for the carriage bolt 58 and to permit adjustment of the position of the subassembly 54 relatively towards and away from the subassembly 54' thereby to permit use of the tool with substrates and sockets of different sizes.

Each of the side plates 90, 92 has a slightly enlarged upper end 102 which has a rectangular opening 104 therein and a laterally extending integral ear 106. In the assembled tool, the side plates are on each side of a link 108 which is part of the actuating means and which is confined for vertical movement between the side plates by projections 115 on the opposed surfaces of the side plates. The link has a lower end 110 which is pivotally mounted on the yoke 34 and an upper end 112 which has thickened wall sections as shown. These thickened wall sections 114 are received in the rectangular openings 104 thereby to guide the link during vertical movement as will be described below.

The other element of the actuating means comprises a bell crank lever 116 having arms 124, 125 extending from its pivotal axis which extends through an opening 122. The pivot pin 118 for this pivotal axis extends through aligned openings 120 in the frame section 82 which is provided with a recess as shown in FIG. 7 for the movable portion of the frame assembly. The side plates 90, 92 are also pivoted on the pivot pin 118 by means of openings 127 which are provided in the ears 106.

The arm 124 of the bell crank has a slot 126 through which a pin 128 extends. This pin has its ends received in the enlarged upper end portion of the link so that when the bell crank is swung through a counter-clockwise arc, as viewed in FIG. 2, the pin 128 and the link will be moved upwardly from the position shown. The pin 128 has its ends received in aligned openings 130 in the enlarged upper end of the link 108. A link spring 132 is provided as shown in FIG. 2 and has its lower end 134 hooked around a pin 136 which also extends between the side plates 90, 92. An opening 138 is provided in the link to permit movement of the link with respect to this fixed pin. The upper end 140 of the spring 132 is hooked through an opening 142 in the arm 124 of a bell crank which is below the slot 126.

A frame spring 144 is provided on the yoke 32 between the yoke arm and the lower end of the link. This spring biases the movable section of the frame assembly in a clockwise direction as viewed in FIG. 2, but permits movement in a counter-clockwise direction when the yoke arms are engaged with a substrate or a socket.

When the tool is used to assemble a PGA substrate to a socket, the PGA substrate is first positioned on the socket assembly with the pins in alignment with the openings on the upper surface of the socket. The second frame arms are then moved to their retracted positions and the tool is positioned as shown in FIG. 2 with the inwardly turned ends of the yoke arms extending between the lower surface of the socket and the surface of the circuit board. The operator then grasps the tool by the intermediate portion of the fixed frame and by the arm of the bell crank. The arm is then swung in a counter-clockwise direction. Since the yoke arms are locked beneath the surface of the socket, the movement of the lever arm requires that the frame assembly move downwardly from the position shown so that the ends of the first frame arms move against the upwardly facing surface of the PGA substrate. The substrate is thereby pushed into assembled relationship to the socket.

When the tool is used to extract a substrate from a socket, FIGS. 5 and 6, the second frame arms are moved to their extended positions. In FIG. 5, the second frame arm on the left is shown in its extended position and the depressor on the right is shown in its depressed condition so that the second frame arm on the right can be moved downwardly to its extended position. The lever arm of the bell crank is then moved in a counter-clockwise direction as described above. In this instance, the frame assembly must remain stationary for the reason that the ends of the second frame arms are against the surface of the circuit board. The yoke therefore is required to move upwardly from the position of FIG. 5 to the position of FIG. 6 and in doing so, the substrate is pulled upwardly and disassembled from the socket assembly.

I claim:

1. An insertion-extraction tool for assembling a substrate package to, and disassembling a substrate package from, a socket which is mounted on a circuit board, the tool comprising:

a frame assembly, a yoke, spaced-apart yoke arms which extend from the yoke, first and second pairs of frame arms, and actuating means, the yoke being in the frame assembly, the yoke arms being spaced-apart and extending beyond the frame assembly, the yoke arms having opposed first side surfaces and oppositely facing second side surfaces, the free ends of the yoke arms having gripping portions, the first pair of frame arms being between the first side surfaces, the second pair of frame arms being proximate to the second side surfaces so that each yoke arm is between one first frame arm and one second frame arm, the first frame arms being fixed to the frame assembly and having free ends which are between the yoke and the free ends of the yoke arms, the second frame arms being slidably mounted on the frame assembly for movement between extended positions and retracted positions, the second frame arms having free ends which are beyond the free ends of the yoke arms when the second frame arms are in their extended positions, and which are between yoke and the free ends of the yoke arms when they are in their retracted positions, the actuating means being effective to move the yoke and the frame assembly relative to each other in directions parallel to the yoke arms and the frame arms whereby, the substrate package can be assembled to the socket by moving the second frame arms to their retracted positions, locating the substrate package on the socket with the substrate pins in alignment with the socket receptacles, locating the tool above the substrate with the free ends of the yoke arms between the surface of the circuit board and the underside of the socket and moving the frame assembly towards the free ends of the yoke arms by use of the actuating means whereby the free ends of the first frame arms will move against the substrate and push the substrate into assembled relationship with the socket, and the substrate can be disassembled from the socket by moving the second frame arms to their extended positions, locating the tool above the substrate with the free ends of the second frame arms on the surface of the circuit board and with the free ends of the yoke arms between the opposed surfaces of the substrate and the socket, and moving the yoke away from the free ends of the second frame arms by use of the actuating means whereby the yoke will pull the substrate from the socket.

2. A tool as set forth in claim 1 characterized in that the frame assembly comprises first and second frame sections, each frame section having one yoke arm, one first frame arm, and one second frame arm thereon, the first and second frame sections being movable relatively towards and away from each other in directions which extend transversely of the yoke arms and the frame arms thereby to permit movement of the gripping portions of the yoke arms towards each other and placement of the gripping portions between the opposed surfaces of the substrate package and the socket and between the socket and the surface of the circuit board during removal and insertion respectively.

3. A tool as set forth in claim 2 characterized in that at least one of the frame sections has a subassembly thereon, the associated yoke arm, the associated first frame arm, and the associated second frame arm of the one frame section being on the subassembly, the subassembly being adjustably secured to its associated frame section for adjustment towards and away from the yoke arm and frame arms on the other frame section whereby the tool can be used for substrates and sockets of different sizes.

4. A tool as set forth in claim 3 characterized in that the actuating means comprises a link which extends from the yoke at a location substantially mid-way between the yoke arms, and a lever is provided for moving the link.

5. A tool as set forth in claim 4 characterized in that the lever comprises a bell crank which is pivoted to, the frame assembly on a fixed pivotal axis, the bell crank having one bell crank arm which extends towards, and is pivoted to, the link, the other bell crank arm normally extending from the fixed pivotal axis and serving as a movable tool handle.

6. An insertion/extraction tool for assembling a substrate package to, and disassembling a substrate package from, a socket which is mounted on a circuit board, the tool comprising:

a frame assembly, a yoke, spaced-apart yoke arms which extend from the yoke, first and second pairs of frame arms, and actuating means, the frame assembly having a first end, the yoke being in the frame assembly proximate to the first end, the yoke arms being spaced-apart and extending towards, and beyond, the first end and having free ends, the yoke arms having opposed first side surfaces and oppositely facing second side surfaces, the free ends of the yoke arms having gripping portions, the first pair of frame arms being substantially against the first side surfaces, the second pair of frame arms being substantially against the second side surfaces so that each yoke arm is between one first frame arm and one second frame arm, the first frame arms having free ends which are between the first end of the frame assembly and the free ends of the yoke arms, the second frame arms being slidably mounted on the frame assembly for movement between extended positions and retracted positions, the second frame arms having free ends which are remote from the first end of the frame assembly and beyond the free ends of the yoke arms when the second frame arms are in their extended positions, the free ends of the second frame arms being proximate to the first end of the frame assembly when they are in their retracted positions, the actuating means being effective to move the yoke and the first end of the frame assembly relatively towards and away from each other whereby, the substrate package can be assembled to the socket by moving the second frame arms to their retracted positions, locating the substrate package on the socket with the substrate pins in alignment with the socket receptacles, locating the tool above the substrate with the free ends of the yoke arms between the surface of the circuit board and the underside of the socket and moving the frame assembly towards the free ends of the yoke arms by the actuating means whereby the free ends of the first frame arms will move against the substrate and push the substrate into assembled relationship with the socket, and the substrate can be disassembled from the socket by moving the second frame arms to their extended positions, locating the tool above the substrate with the free ends of the second frame arms on the surface of the circuit board and with the free ends of the yoke arms between the opposed surfaces of the substrate and the socket and moving the yoke away from the first end by the actuating means whereby the yoke arms will pull the substrate from the socket.

7. A tool as set forth in claim 6 characterized in that the frame assembly comprises first and second frame sections which are movable relatively towards and away from each other, the first and second frame sections each having one yoke arm, one first frame arm, and one second frame arm thereon.

8. A tool as set forth in claim 6 characterized in that the frame assembly comprises first and second frame sections, each frame section having one yoke arm, one first frame arm, and one second frame arm thereon, the first and second frame sections being movable relatively towards and away from each other at the first end of the frame assembly in directions which extend transversely of the yoke arms and the frame arms thereby to permit movement of the gripping portions of the yoke arms towards each other and placement of the gripping portions between the opposed surfaces of the substrate package and the socket and between the socket and the surface of the circuit board during removal and insertion respectively.

9. A tool as set forth in claim 8 characterized in that the frame assembly has a second end, the first and second frame sections being pivoted to each other at the second end thereby to permit the movement of the first and second frame sections towards and away from each other.

10. A tool as set forth in claim 9 characterized in that at least one of the frame sections has a subassembly thereon, the associated yoke arm, the associated first frame arm, and the associated second frame arm of the one frame section being on the subassembly, the subassembly being adjustably secured to its associated frame section for adjustment towards and away from the yoke arm and frame arms on the other frame section whereby the tool can be used for substrates and sockets of different sizes.

11. A tool as set forth in claim 10 characterized in that each of the frame sections has a subassembly thereon.

12. A tool as set forth in claim 10 characterized in that the yoke comprises a rod-like member which extends transversely of the yoke arms and the frame arms, the yoke arms being secured to the yoke by means of holes in the yoke arms through which the yoke extends.

13. A tool as set forth in claim 12 characterized in that the second frame arms have yoke receiving slots through which the yoke extends, the yoke-receiving slots permitting movement of the second frame arms between their extended and retracted positions.

14. A tool as set forth in claim 13 characterized in that detent means are provided in each of the frame sections for retaining the second frame arms in their extended positions and in their retracted positions.

15. A tool as set forth in claim 14 characterized in that the detent means for each second frame arm comprises spaced-apart openings in the second arm and a detent plunger in the associated frame section which is received in the openings.

16. A tool as set forth in claim 15 characterized in that the actuating means comprises a link which extends from the yoke at a location substantially mid-way between the first and second yoke arms, the link extending towards the second end of the frame assembly, and a lever is provided on the frame assembly for moving the link relatively towards and away from the second end of the frame assembly.

17. A tool as set forth in claim 16 characterized in that a link spring is provided which biases the link towards the first end of the frame assembly.

18. A tool as set forth in claim 17 characterized in that the lever comprises a bell crank which is pivoted to the frame assembly on a fixed pivotal axis, the bell crank having one bell crank arm which extends towards, and is pivoted to, the link, the other bell crank arm normally extending obliquely from the fixed pivotal axis and serving as a movable tool handle.

19. A tool as set forth in claim 18 characterized in that a frame spring is provided for biasing the frame sections away from each other at the first end, the frame sections being movable towards each other with accompanying compression of the frame spring.

* * * * *